United States Patent [19]

Sasai et al.

[11] Patent Number: 5,307,321
[45] Date of Patent: Apr. 26, 1994

[54] SEMICONDUCTOR MEMORY DEVICE WITH PARTICULAR BANK SELECTOR MEANS

[75] Inventors: Kiyotaka Sasai, Tokyo; Tohru Sasaki, Kawasaki, both of Japan

[73] Assignee: Kabushiki Kaisha Toshiba, Kawasaki, Japan

[21] Appl. No.: 953,206

[22] Filed: Sep. 29, 1992

Related U.S. Application Data

[63] Continuation of Ser. No. 535,491, May 1, 1990, abandoned.

[30] Foreign Application Priority Data

May 2, 1989 [JP] Japan .................................. 1-111978

[51] Int. Cl.$^5$ ............................................... G11C 8/02
[52] U.S. Cl. ........................... 365/230.03; 365/189.02; 365/189.08; 365/230.06; 365/205
[58] Field of Search ....................... 365/230.03, 189.02, 365/205, 189.01, 189.08, 230.04, 230.06, 205

[56] References Cited

U.S. PATENT DOCUMENTS

| | | | |
|---|---|---|---|
| 4,821,239 | 4/1989 | Leu | 365/205 |
| 4,831,590 | 5/1989 | Ichinose | 365/205 |
| 4,881,200 | 11/1989 | Urai | 365/230.03 |
| 4,893,280 | 1/1990 | Gelsomini et al. | 365/189.08 |
| 4,903,235 | 2/1990 | Kubota et al. | 365/205 |
| 4,931,994 | 6/1990 | Matsui et al. | 365/230.03 |
| 4,939,696 | 7/1990 | Katsuo et al. | 365/230.03 |
| 4,954,987 | 9/1990 | Auvinen et al. | 365/189.02 |
| 4,975,877 | 12/1990 | Bell | 365/189.02 |

FOREIGN PATENT DOCUMENTS

58-137179 8/1983 Japan ................................ 365/189.02

*Primary Examiner*—Joseph E. Clawson, Jr.
*Attorney, Agent, or Firm*—Foley & Lardner

[57] ABSTRACT

A semiconductor memory device has an aligner for aligning data. The aligner is disposed in front of a sense amplifier to directly receive data from an internal bus of a memory. This arrangement greatly reduces the time period from a data read to an arithmetic operation.

4 Claims, 6 Drawing Sheets

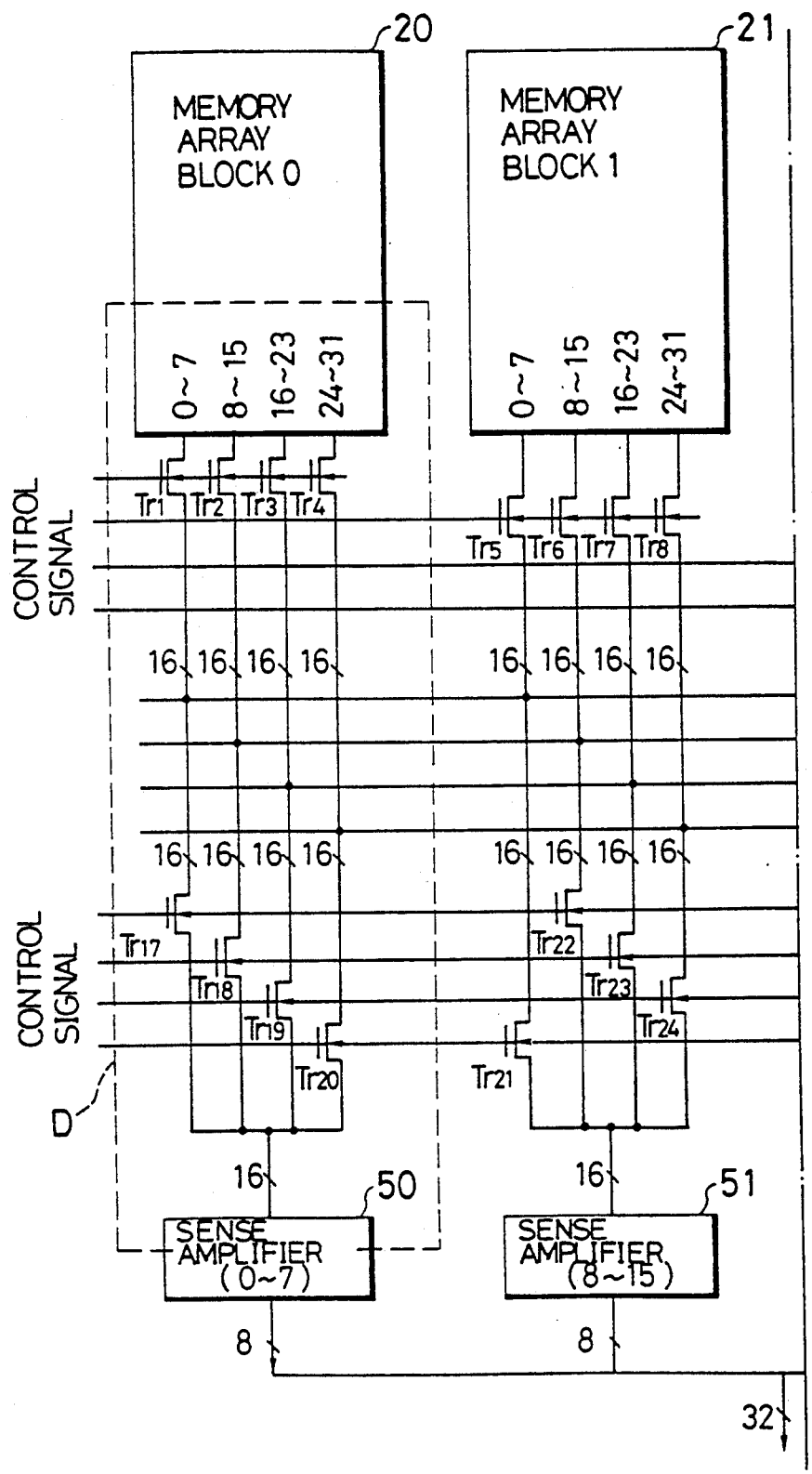

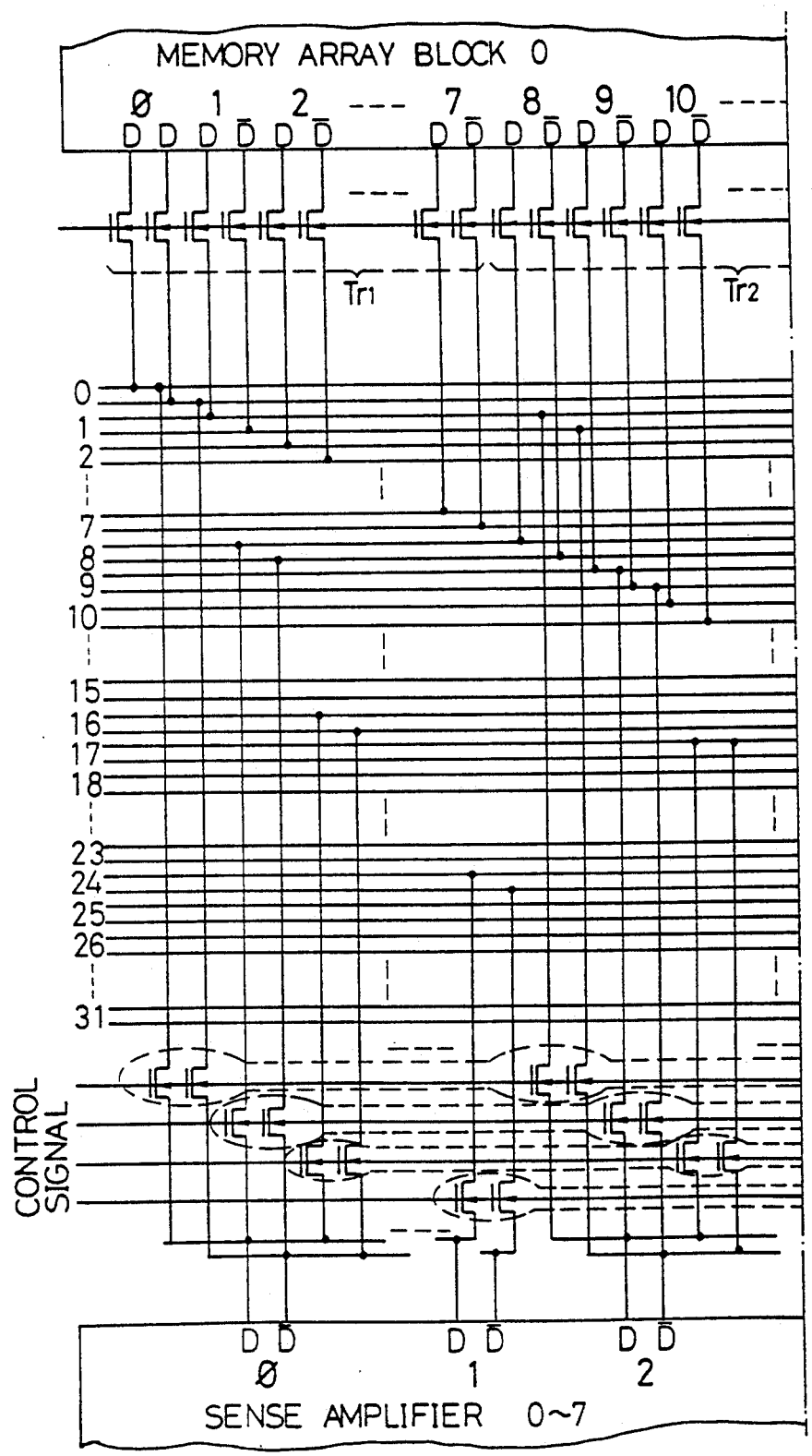

SEMICONDUCTOR MEMORY DEVICE WITH PARTICULAR BANK SELECTOR MEANS

This application is a continuation of application Ser. No. 07/535,491, filed May 1, 1990, now abandoned.

BACKGROUND OF THE INVENTION

1. Field of the Invention

The present invention relates to a semiconductor memory device, and particularly to a semiconductor memory device to be employed as a microprocessor cache memory that can quickly align data after the data is read.

2. Description of the Prior Art

A microprocessor frequently incorporates a cache memory. To read data from the cache memory and execute an arithmetic operation with the data, the data shall be aligned. For this purpose, an aligner is disposed between the cache memory and an arithmetic circuit.

According to prior art, data read out of the cache memory is provided to the aligner through a sense amplifier. Thereafter, the aligner, which comprises a group of CMOS logic gate transistors or transfer gate transistors, aligns the data and transfers the same to the arithmetic circuit.

FIG. 1 shows a conventional arrangement from a memory array 1 to an aligner 10. This arrangement processes a signal of 4 bytes, i.e., 32 bits. Data in the memory array 1 is selected by a column selector 2 and read out. The read data is amplified by a sense amplifier 3, and aligned by the aligner 10. The aligner 10 includes wires W and selectors 4 to 7. The aligner 10 transfers the data to an arithmetic circuit.

Each of the selectors 4 to 7 may comprise a group of CMOS logic gate transistors for processing respective bits of the data. FIG. 2 shows such a circuit disposed in the selectors to process one bit. The circuit of FIG. 2 comprises AND gates A1 to A4, NOR gates NOR1 and NOR2, and a NAND gate NAND. Each of the selectors 4 to 7 involves eight such circuits to select one of four bytes according to control signals AE to DE and provides an output signal Z from the NAND gate NAND.

The prior art of FIG. 1 reads data from the memory array 1, which serves as, for example, a cache memory. The read data is passed through the column selector 2 and sense amplifier 3, and applied to the aligner 10, which aligns the data. This prior art arrangement has several drawbacks.

Firstly, to transfer a data output of the sense amplifier 3 to the selectors 4 to 7, the wires W must be arranged. The wires W have a very complicated arrangement and occupy a large area, thereby increasing the capacitance and load.

Secondly, the selectors 4 to 7 that may be composed of CMOS logic gate transistors as shown in FIG. 2 or transfer gate transistors (not shown), require a large number of logic gates arranged in several stages. This may increase the delay. This delay and a delay caused by the wires W deteriorate the processing speed in reading data from the memory and transferring the same to the arithmetic circuit.

SUMMARY OF THE INVENTION

An object of the present invention is to provide a semiconductor memory device that can realize a high-speed operation of reading, aligning, and transferring data, and reduce the area occupied by an aligner, thereby minimizing the size of the device.

In order to accomplish the object, a semiconductor memory device according to the present invention has an aligner inserted in front of respective sense amplifiers and uses an existing internal bus provided for a memory such as a cache memory. The aligner according to the present invention is simple with a single stage of transfer gate transistors.

Unlike the prior art, the semiconductor memory device of the present invention with the aligner disposed in front of the respective sense amplifiers does not require wires to be exclusively arranged for the aligner. The reason of this is because the present invention utilizes an existing internal bus. Accordingly, the present invention can reduce the delay time caused by the wires as well as the total delay time by virtue of the single stage of transfer gate transistors, thus realizing a high-speed operation. Since the wires are not needed, the area occupied by the aligner can be reduced.

These and other objects, features and advantages of the present invention will be more apparent from the following detailed description of preferred embodiments in conjunction with the accompanying drawings.

BRIEF DESCRIPTION OF THE DRAWINGS

FIGS. 3, 3A and 3B are a block diagram and circuit diagrams, respectively, showing a semiconductor memory device according to an embodiment of the present invention; and FIG. 4 is a block diagram and FIGS. 4A and 4B are circuit diagrams showing the details of a part of FIG. 3.

DETAILED DESCRIPTION OF THE EMBODIMENT

Figure 1:
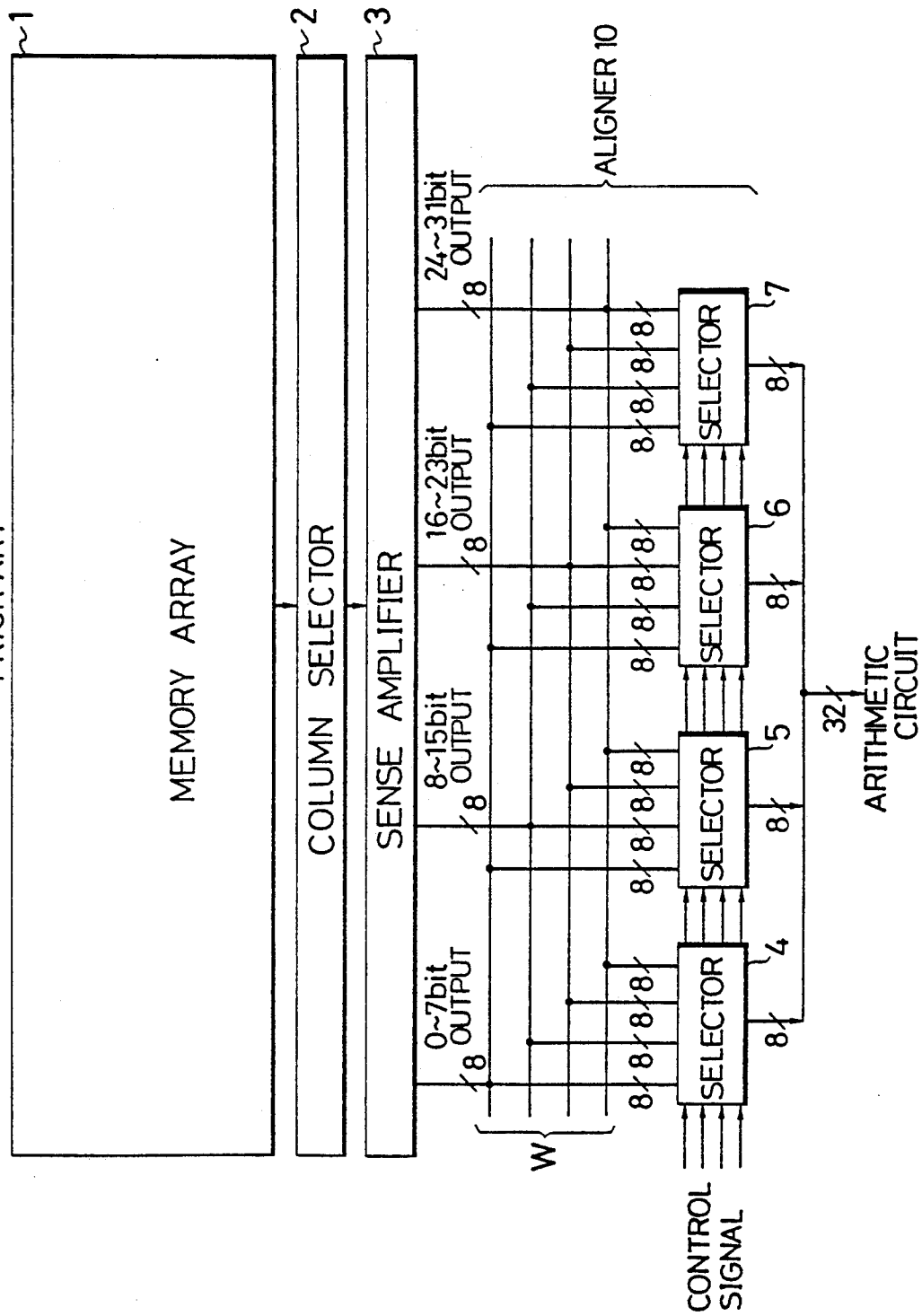
FIG. 1 is a block diagram showing a semiconductor memory device with an aligner according to a prior art.
Figure 2:
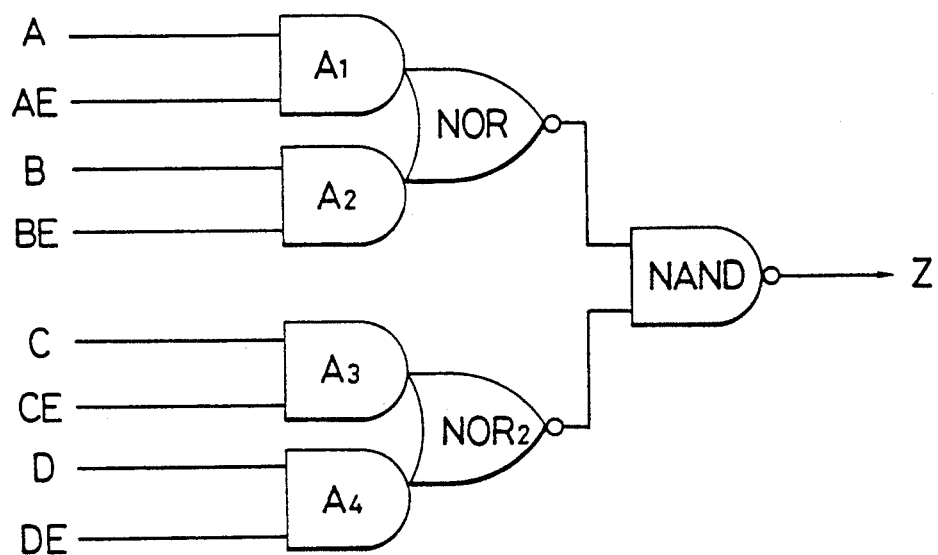
FIG. 2 is a circuit diagram showing an element of the aligner of FIG. 1.
Figure 3B:
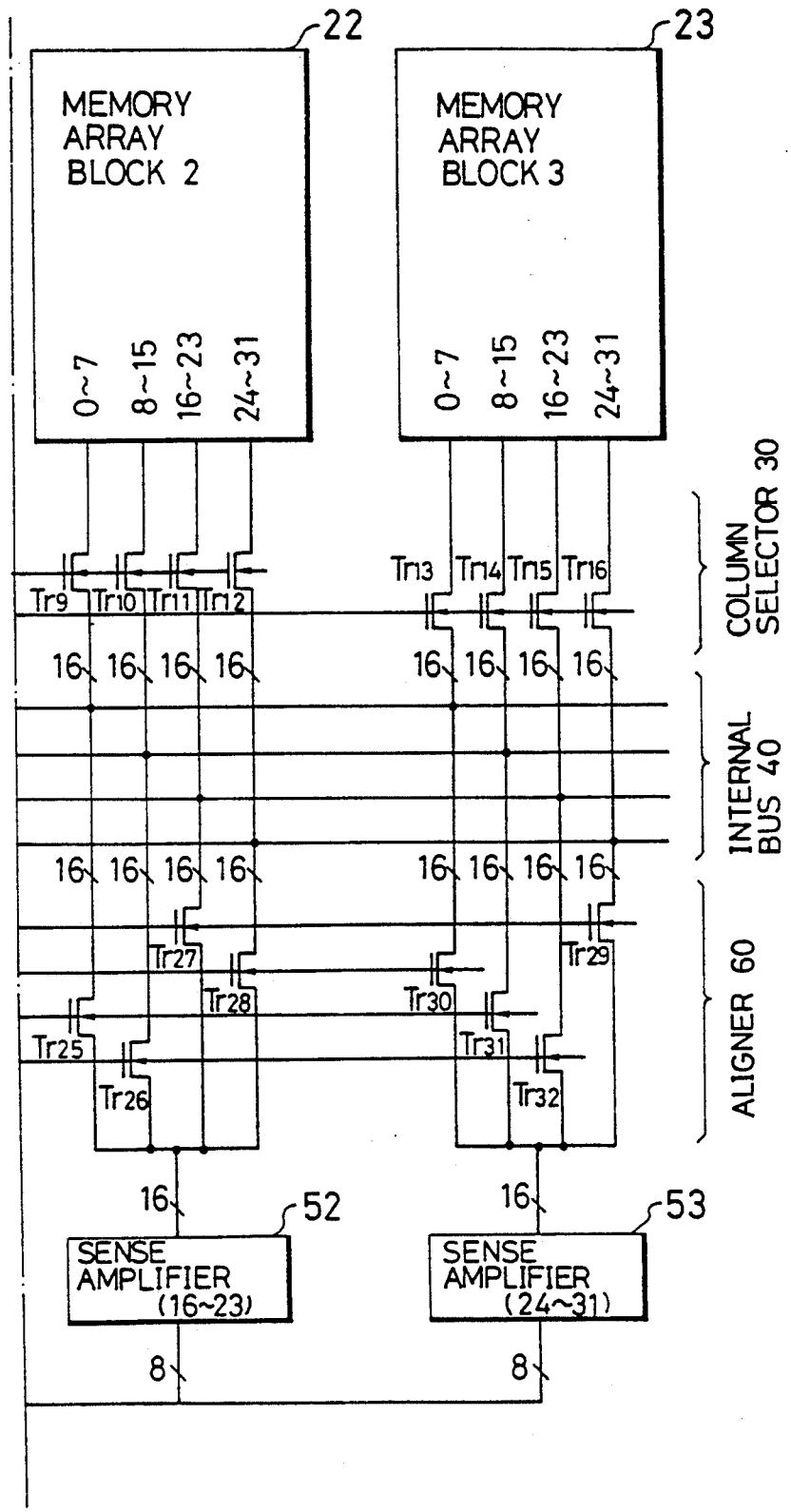

FIG. 3 is a block diagram showing a semiconductor memory device according to the embodiment of the present invention. This embodiment processes a signal of four bytes, i.e., 32 bits. Memory array blocks 20 to 23 are bank cache memories incorporated in a microprocessor. Each of the memory array blocks 20 to 23 has output terminals for the four bytes, and the memory array blocks 20 to 23 are provided with transfer gate transistors Tr1 to Tr4, Tr5 to Tr8, Tr9 to Tr12, and Tr13 to Tr16, respectively. These transfer gate transistors Tr1 to Tr16 form a column selector 30. Although FIG. 3 depicts one transfer gate transistor for each byte, the one transfer gate transistor actually involves a plurality of transfer gate transistors for transferring respective bits of a corresponding byte, as will be explained later in detail.

The column selector 30 has four control signal lines, and a common gate signal is transmitted through one of the four control signal lines to the transfer gate transistors of one of the memory array blocks 20 to 23, thereby selecting the one memory array block. The contents of the selected memory array block are then transferred to an internal bus 40, which is of a usual type. The internal bus 40 is connected to transfer gate transistors Tr17 to Tr32. The transfer gate transistors Tr17 to Tr32 form an aligner 60, and are driven byte by byte according to a common control signal. The transfer gate transistors Tr17 to Tr32 are connected to sense amplifiers 50 to 53. Similar to the transfer gate transistors Tr1 to Tr16, each of the transfer gate transistors Tr17 to Tr32 actually involves a plurality of transfer gate transistors for transferring respective bits of a corresponding byte.

Data reading and aligning operations of the above arrangement will be explained.

One of the four control signal lines of the column selector 30 is set to "1" and the others to "0", thereby selecting one of the memory array blocks 20 to 23. From the selected memory array block, a signal of four bytes is read and transferred to the internal bus 40.

One of the four control signal lines of the aligner 60 is set to "1" and the others to "0" to turn ON those of the transfer gate transistors Tr17 to Tr32 connected to the control signal line of "1." Then, according to an arrangement of the transfer gate transistors Tr17 to Tr32, the four bytes of the signal on the internal bus 40 are transferred to the sense amplifiers 50 to 53, respectively. For example, if a signal of "1000" is given from the top to the bottom of the four control signal lines of the column selector 30, and a signal of "0001" from the top to the bottom of the four signal lines of the aligner 60, highest byte data (bits 0 to 7) of the memory array block 20 are transferred to the sense amplifier 51, second highest byte data (bits 8 to 15) to the sense amplifier 52, third highest byte data (bits 16 to 23) to the sense amplifier 53, and lowest byte data (bits 24 to 31) to the sense amplifier 50. These sense amplifiers amplify the byte data, and provide an output signal of 4 bytes, i.e., 32 bits.

The above arrangement employs a differential data transfer technique with the use of a data signal and an inverted signal of the data signal. This will be explained with reference to FIG. 4 which is an enlarged view of an area defined by a dotted line D of FIG. 3.

Figure 4B:
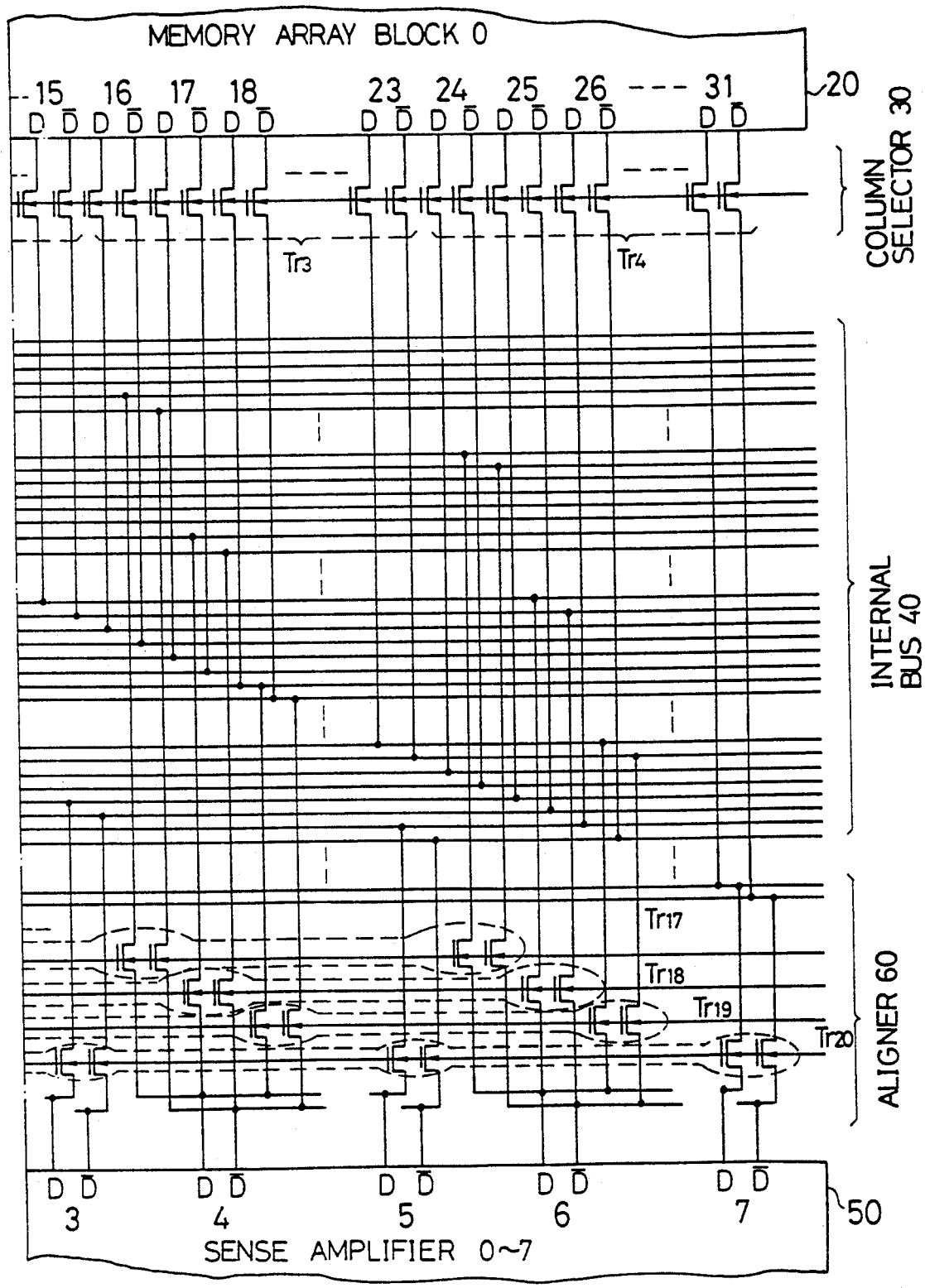

In FIG. 4, the memory array block 20 has the output terminals of four bytes (32 bits) that involve 64 signal lines including those for inverted bits. The 64 signal lines are connected to 64 transfer gate transistors, respectively, that receive a common gate signal. These 64 transfer gate transistors are connected to 64 internal buses, respectively. The sense amplifier 50 has input terminals of one byte (8 bits) involving 16 input lines with those for inverted bits. These 16 input lines are connected to corresponding bit lines of any byte through the transfer gate transistors Tr17 to Tr20. Transfer gate transistors connected to the same byte are driven by one common gate signal. For example, sixteen transfer gate transistors that constitute the transfer gate transistor 17 connected to the first byte (bits 0 to 7) of the memory array block 20 are driven by one common control signal.

Various modifications will become possible for those skilled in the art after receiving the teachings of the present disclosure without departing from the scope thereof.

What is claimed is:

1. A semiconductor memory device, comprising:
   a general data bus;
   a memory including a plurality of memory blocks, each of said plurality of memory blocks having a plurality of output lines, said plurality of memory blocks providing memory block data signals on said plurality of output lines;
   a column selector coupled to said plurality of output lines of said plurality of memory blocks and coupled to said general data bus, said column selector selecting said plurality of output lines from one of said plurality of memory blocks and providing said memory block data signals from said plurality of output lines from said one of said plurality of memory blocks to said general data bus in response to an external selection control signal;
   an aligner coupled to said general data bus, said aligner having a plurality of aligner output lines, said aligner receiving said memory block data signals from said general data bus and arranging said memory block data signals into one of a plurality of arrangements in response to an external alignment control signal and providing said one of said plurality of arrangements of said memory block data signals at said plurality of aligner output lines; and
   a sense amplifier having a plurality of input lines coupled to said plurality of aligner output lines.

2. The semiconductor device as claimed in claim 1, wherein said plurality of output lines of said plurality of memory blocks provide a plurality of bytes as memory block data signals.

3. The semiconductor memory device as claimed in claim 2, wherein said memory blocks each provide a plurality of bytes as memory block data signals at the plurality of output lines.

4. The semiconductor memory device as claimed in claim 1, wherein said aligner includes a plurality of transfer gate transistors.

* * * * *